United States Patent
Daniels

(10) Patent No.: US 11,363,357 B2
(45) Date of Patent: Jun. 14, 2022

(54) PYDEPYPER ULTIMATE MOBILITY SYSTEM

(71) Applicant: Yoshea Daniels, Christiansted, VI (US)

(72) Inventor: Yoshea Daniels, Christiansted, VI (US)

( * ) Notice: Subject to any disclaimer, the term of this patent is extended or adjusted under 35 U.S.C. 154(b) by 0 days.

(21) Appl. No.: 16/742,967

(22) Filed: Jan. 15, 2020

(65) Prior Publication Data

US 2021/0160598 A1 May 27, 2021

Related U.S. Application Data

(60) Provisional application No. 62/938,425, filed on Nov. 21, 2019.

(51) Int. Cl.
| | |
|---|---|
| *H04R 1/02* | (2006.01) |
| *H04R 9/06* | (2006.01) |
| *H03G 5/16* | (2006.01) |
| *H03G 5/00* | (2006.01) |

(52) U.S. Cl.
CPC ............... *H04R 1/02* (2013.01); *H03G 5/005* (2013.01); *H03G 5/165* (2013.01); *H04R 2201/023* (2013.01); *H04R 2420/07* (2013.01)

(58) Field of Classification Search
CPC ........... H04R 1/02; H03G 5/005; H03G 5/165
See application file for complete search history.

(56) References Cited

U.S. PATENT DOCUMENTS

| | | | | |
|---|---|---|---|---|
| 4,342,244 | A * | 8/1982 | Perkins | G10H 1/32 |
| | | | | 84/723 |
| 6,712,249 | B2 * | 3/2004 | Magnusson | H04R 5/023 |
| | | | | 224/153 |
| 9,614,371 | B1 * | 4/2017 | Farkas | H02J 5/005 |
| 9,635,445 | B1 * | 4/2017 | Ridley | H04R 1/028 |
| 2003/0121401 | A1 * | 7/2003 | Ito | G10H 1/0083 |
| | | | | 84/625 |
| 2008/0036915 | A1 * | 2/2008 | Nagakura | G10G 7/02 |
| | | | | 348/569 |
| 2013/0101134 | A1 * | 4/2013 | Betts-Lacroix | H04S 7/30 |
| | | | | 381/80 |
| 2015/0078579 | A1 * | 3/2015 | Lopez | H04R 5/02 |
| | | | | 381/81 |
| 2015/0195635 | A1 * | 7/2015 | Garfio | H04R 31/006 |
| | | | | 381/386 |
| 2015/0245134 | A1 * | 8/2015 | Liu | H04R 1/44 |
| | | | | 381/334 |
| 2017/0039024 | A1 * | 2/2017 | Vansickel | H05B 45/20 |
| 2017/0155987 | A1 * | 6/2017 | Williamson | H04R 1/025 |
| 2018/0007463 | A1 * | 1/2018 | Kim | H04R 1/345 |
| 2018/0352334 | A1 * | 12/2018 | Family | H04R 3/12 |

* cited by examiner

*Primary Examiner* — Simon King

(57) ABSTRACT

A system that comprises an instrument microphone comprising a clip and a wireless transmitter is disclosed. The clip is constructed to couple the instrument microphone to a brass or woodwind instrument. The system comprises a headgear apparatus microphone comprising a wireless transmitter. The headgear apparatus microphone is constructed to coupled to a head of a vocalist. The system comprises a Bluetooth speaker.

3 Claims, 2 Drawing Sheets

PYDEPYPER ULTIMATE MOBILITY SYSTEM

CROSS-REFERENCES TO RELATED APPLICATIONS

This application claims priority to, and incorporates by reference herein in its entirety, U.S. Provisional Patent Application Ser. No. 62/938,425, filed Nov. 13, 2019.

1). BACKGROUND a). Portable battery powered PA with bluetooth, reverb, and wireless transmitter microphone.

2). DESCRIPTIVE ADVANTAGES & IMPROVEMENT a). Bag-pack/strappable, wireless, audible mobility speaker, with built in receiver, digital reverb/delay, and transmitter clip on instrument or headgear apparatus microphone.

3. DESCRIPTION OF FIGURES

Figure 1:
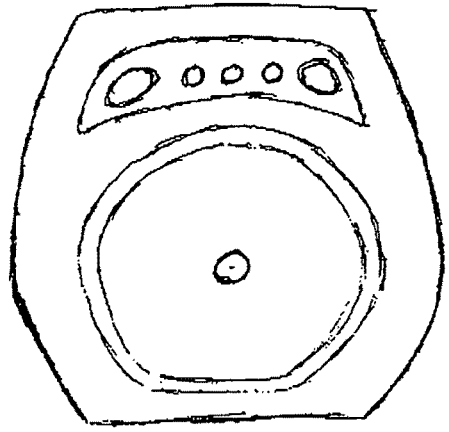

FIG. 1: Front view of the bag pack (strappable) wireless, (battery powered) speaker system, with Bluetooth, and built in receiver device.

Figure 2:
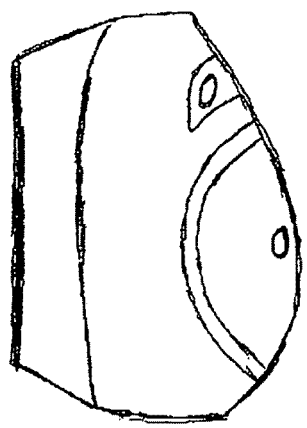

FIG. 2: Side view of the bag pack (strappable) wireless, (battery powered) speaker system, with Bluetooth, and built in receiver device.

Figure 3:
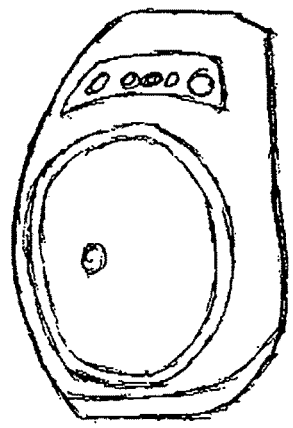

FIG. 3: 45 degree angle view of the bag pack (strappable) wireless, (battery powered) speaker system, with Bluetooth, and built in receiver device.

Figure 4:
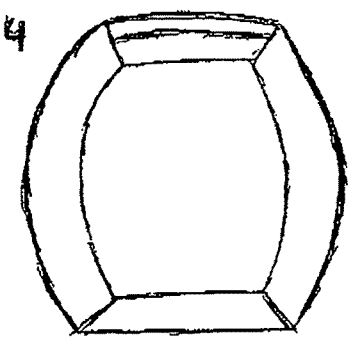

FIG. 4: Rear view of the bag pack (strappable) wireless, (battery powered) speaker system, with Bluetooth, and built in receiver device.

Figure 5:
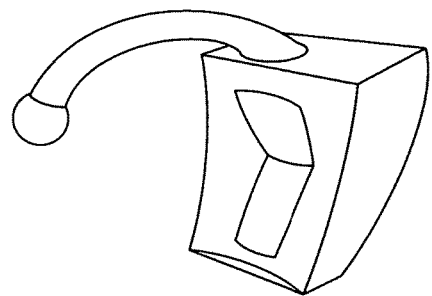

FIG. 5: A view showing Instrument Microphone.

Figure 6:
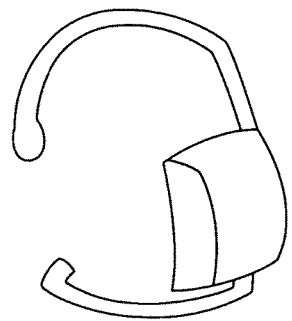

FIG. 6: A view showing Headgear Microphone.

Figure 7:

FIG. 7: A musician using the clip-on instrument microphone invention.

Figure 8:

FIG. 8: A musician using the headset microphone invention.

4). DETAIL DESCRIPTION OF INVENTION

This innovative all in one portable sound system, incorporates various components of cutting-edge technology into a sensible unique package. Comprising of unique wireless (battery operated) transmitter microphone(s), design to accommodate instrumentalist, and vocalist alike.

Clip on version offers hand free mobility from the microphone, to brass, and woodwind instrument players. Whereas the headset apparatus version allow vocalist, poets, rappers etc. to perform free of the constraint experience with hand held microphone. Both versions feature on/off buttons, and volume control. The transmitter microphone simply transmits any audible sound wirelessly to a programmable receiver built into the speaker system. The speaker system is design to enhance, amplify, and make clearer the signal received through the built-in receiver device via controller knobs, and buttons on upper rear of speaker system. This is inclusive of stereo equalizer ('EQ'), atmospheric sounds via the effects module within the design of the speaker system. The compact design, and weight of the speaker, allows for easy, and comfortable mobility; by way of a tailor-made bag-pack which houses the "womb" like curvature of the speaker. There's also the option of a shoulder strap apparatus, which easily clips on to appropriate fixtures on rear of padded speaker, offering comfort while strapped, to a performer on the go. The speaker system is fully audible, even when functioning requires mobility; free of any obstruction from either bag-pack or shoulder strap apparatus. The speaker dimensions are approximately 13" (W)×9" (D)×13" (H), and offers powerful dynamic sound quality via the drivers, midrange, and tweeters.

The invention claimed is:

1. A system comprising: an instrument microphone comprising a clip and a wireless transmitter, the clip constructed to couple the instrument microphone to a brass or woodwind instrument; a headgear apparatus microphone comprising a wireless transmitter, the headgear apparatus microphone constructed to coupled to the head of a vocalist; wherein each of the instrument microphone and the headset microphone have an on/off button, volume control and battery powered; and a Bluetooth speaker, the Bluetooth speaker battery powered, the Bluetooth speaker comprising a wireless receiver, the wireless receiver constructed to receive wireless transmissions from the instrument microphone and the headset microphone, the Bluetooth speaker having: a built in digital reverb/delay; a built in digital device acoustic equalizer (EQ) that enhances sound before amplification; an effects module; one or more control knobs and buttons; a driver; a midrange; a tweeter and a convex curved face.

2. The system of claim 1, wherein: the Bluetooth speaker is a strappable padded speaker.

3. The system of claim 1, wherein: the Bluetooth speaker comprises a shoulder strap.

\* \* \* \* \*